(12) United States Patent
Ng

(10) Patent No.: US 10,097,338 B1
(45) Date of Patent: Oct. 9, 2018

(54) ISOLATOR WITH NARROW-RANGE CLOCK SCRAMBLING UNIT

(71) Applicant: AVAGO TECHNOLOGIES GENERAL IP (SINGAPORE) PTE. LTD., Singapore (SG)

(72) Inventor: Gek Yong Ng, Singapore (SG)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/483,131

(22) Filed: Apr. 10, 2017

(51) Int. Cl.
   H04L 7/00 (2006.01)
   H03K 3/037 (2006.01)
   G05F 1/56 (2006.01)
   H04L 7/033 (2006.01)

(52) U.S. Cl.
   CPC ............ *H04L 7/0016* (2013.01); *G05F 1/561* (2013.01); *H03K 3/037* (2013.01); *H04L 7/033* (2013.01)

(58) Field of Classification Search
   CPC ....... H04L 7/0016; H04L 7/033; G05F 1/561; H03K 3/037
   USPC .......................................................... 317/354
   See application file for complete search history.

(56) References Cited

U.S. PATENT DOCUMENTS

| | | | | |
|---|---|---|---|---|
| 6,359,983 B1* | 3/2002 | Krone | ................. | H04L 25/0266 375/285 |
| 9,065,461 B1* | 6/2015 | Wong | ...................... | H03M 5/12 |
| 9,526,137 B1* | 12/2016 | Wang | ................. | H05B 33/0815 |
| 9,768,945 B2* | 9/2017 | Mueck | ................... | H04L 7/0016 |
| 2005/0149798 A1* | 7/2005 | Inuzuka | .......... | G01R 31/318536 714/726 |
| 2008/0290444 A1* | 11/2008 | Crawley | ............. | H01L 23/5223 257/503 |
| 2015/0326127 A1* | 11/2015 | Peng | ................. | H02M 3/33507 315/209 R |
| 2017/0201399 A1* | 7/2017 | Adinarayana | ........ | H04B 1/0475 |

OTHER PUBLICATIONS

"Avago Technologies' New ACPL-C797 Sigma-Delta ADC Increase Accuracy and Isolation," Business Wire, Jul. 20, 010.
ACPL-C797 Optically Isolated Sigma-Delta Modulator, Nov. 18, 2013, pp. 1-16, Avago Technologies, United States.
ACPL-796J Optically Isolated Sigma-Delta Modulator, Jul. 27, 2016, pp. 1-16, Avago Technologies, United States.
HCPL-7860/HCPL-786J Optically Isolated Sigma-Delta (S-D) Modulator, Mar. 6, 2015, pp. 1-17, Avago Technologies, United States.

\* cited by examiner

*Primary Examiner* — Helene Tayong

(74) *Attorney, Agent, or Firm* — Sheridan Ross P.C.

(57) ABSTRACT

An isolation system and isolation device are disclosed. An illustrative isolation device is disclosed to include a transmitter side and receiver side separated by an isolation material. One or more components of the transmitter side operate on a clock signal whereas one or more components of the receiver side operate on a scrambled clock signal. The scrambled clock signal is generated to have a different energy distribution than the clock signal and is also generated to have a dominant peak value that is lower than the dominant peak value of the clock signal.

20 Claims, 15 Drawing Sheets

ISOLATOR WITH NARROW-RANGE CLOCK SCRAMBLING UNIT

FIELD OF THE DISCLOSURE

The present disclosure is generally directed toward electronic isolation and devices for accommodating the same.

BACKGROUND

There are many types of electrical systems that benefit from electrical isolation. Galvanic isolation is a principle of isolating functional sections of electrical systems to prevent current flow, meaning that no direct electrical conduction path is permitted between different functional sections. As one example, certain types of electronic equipment require that high-voltage components (e.g., 1 kV or greater) interface with low-voltage components (e.g., 10V or lower). Examples of such equipment include medical devices and industrial machines that utilize high-voltage in some parts of the system, but have low-voltage control electronics elsewhere within the system. The interface of the high-voltage and low-voltage sides of the system relies upon the transfer of data via some mechanism other than electrical current.

Other types of electrical systems such as signal and power transmission lines can be subjected to voltage surges by lightning, electrostatic discharge, radio frequency transmissions, switching pulses (spikes), and perturbations in power supply. These types of systems can also benefit from electrical isolation.

Electrical isolation can be achieved with a number of different types of devices. Some examples of isolation products include galvanic isolators, opto-couplers, inductive, and capacitive isolators. Previous generations of electronic isolators used two chips in a horizontal configuration with wire bonds between the chips. These wire bonds provide a coupling point for large excursions in the difference between the grounds of the systems being isolated. These excursions can be on the order of 25,000 V/usec.

As mentioned above, electrical isolation can be achieved with capacitive, inductive isolators, optical, and/or RF isolators to transmit data across an isolation boundary. Most isolation solutions utilize data sampling at the receiving end. Many sampled data converters require a precision low jitter clock to sample the input signal to achieve good signal linearity. However, at high clock frequencies, the precision clock becomes a source of electromagnetic interference (EMI) and will cause the system with the device on board to fail certain EMI compliance standards.

While it is desirable to have a quality system clock that has small jitter with the clock centered at the intended frequency, this may impart EMI to other devices in close proximity. To reduce the EMI, system designers often face difficult and complex design considerations and implementations, (e.g., short clock PCB traces, putting the device to be clocked as close as possible to the clock distribution source, and transmission lines matching). While these are based on good design practice, actual EMI is hard to predict and can only be known when actual measurement is performed. Designers risk failing the system EMI compliance test in the end even if the system is designed to accommodate certain amounts of EMI.

BRIEF DESCRIPTION OF THE DRAWINGS

The present disclosure is described in conjunction with the appended figures, which are not necessarily drawn to scale.

DETAILED DESCRIPTION

Figure 1:
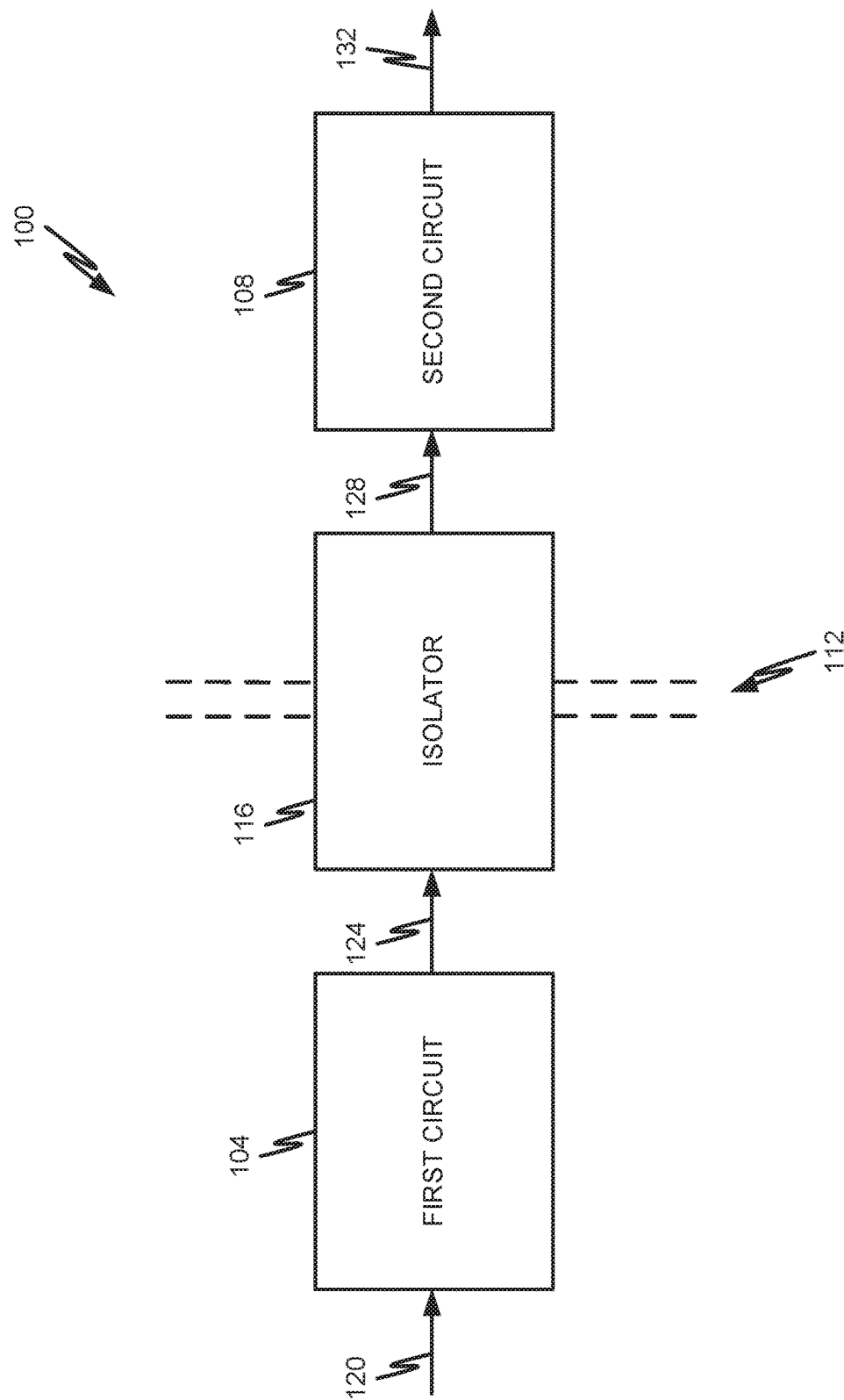
FIG. 1 is a schematic block diagram depicting an isolation system in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-16, various configurations of isolation systems, isolators, and isolation devices are depicted and described. In some embodiments, the isolators described herein may be incorporated into any system which requires current and/or voltage monitoring, but is susceptible to transients. In some embodiments, the isolation system in which an isolator described herein is rated to operate at about 5 kV, 10 kV, or more. Stated another way, the input side (e.g., a high-voltage side) of the isolator or isolation system may be directly connected to a 5 kV, 10 kV, 15 kV or greater source without damaging the isolator or any electronic devices attached to the output side (e.g., a low-voltage side) of the isolator. Accordingly, an isolation system which employs one or more of the isolators disclosed herein may be configured to operate in high-voltage or high-current systems but may also be configured to separate the high-voltage or high-current systems from a low-voltage or low-current system.

It should be appreciated that the disclosed components and concepts may be utilized in any type of isolation system, isolator, or isolation device. For instance, the concepts disclosed herein can be employed by optical isolators (e.g., where optical signals are used to communicate across an isolation material), capacitive isolators (e.g., where capacitive signals are used to communicate across an isolation material), inductive isolators (e.g., where RF or inductive signals are used to communicate across an isolation material), magnetic isolators (e.g., where magnetic signals are used to communicate across an isolation material), etc.

In some embodiments, a galvanic isolator is provided that comprises:

first isolation components that receive an input signal and transmit a modulated signal across an isolation material, the first isolation components including:
  a modulator that modulates the input signal;
  a clock terminal that provides a first clock signal input to the modulator, wherein the first clock signal comprises a first energy distribution across a first frequency spectrum with a first dominant peak value; and
  a transmitter that receives an output from the modulator and transmits the modulated signal across the isolation material;

second isolation components that are electrically isolated from the first isolation components by the isolation material, the second isolation components receiving the modulated signal transmitted by the first isolation components and generating a data output and clock output based on the modulated signal received thereby, the second isolation components including:
  a receiver that receives the modulated signal transmitted by the first isolation components;
  a decoder that receives an output from the receiver and generates the data output and clock output based thereon; and
  a scrambled clock terminal that provides a second clock signal input to the decoder, wherein the second clock signal comprises a second energy distribution with a second dominant peak value, and wherein the second dominant peak value is lower than the first dominant peak value.

Referring now to FIG. 1, a first isolation system 100 will be described in accordance with at least some embodiments of the present disclosure. The system 100 is shown to include a first circuit 104 and second circuit 108 separated by an isolation boundary 112. In some embodiments, an isolator 116 may provide a mechanism for carrying communication signals across the isolation boundary 112.

The first circuit 104 may be operating in a high-voltage environment (e.g., with a ground potential at or exceeding 1 kV) whereas the second circuit 108 may be operating in a low-voltage environment (e.g., with a ground potential below 100V). Of course, the opposite condition may also be true without departing from the scope of the present disclosure. The isolation boundary 112 may provide the mechanism for protecting the low-voltage environment from the high-voltage environment. The isolator 116 may be configured to establish and maintain the isolation boundary 112 while simultaneously facilitating the exchange of communications from the first circuit 104 to the second circuit 108 and vice versa. It should be appreciated, however, that the second circuit 108 may be operating in the high-voltage environment and the first circuit 104 may be operating in the low-voltage environment.

In some embodiments, the first circuit 104 receives a first input signal 120 at a first voltage (e.g., a high voltage). The first circuit 104 outputs a first output signal 124 to the isolator 116. The first output signal 124 is still at the same nominal voltage as the first input signal 120. The isolator 116 communicates information from the first output signal 124 to the second circuit 108 via a second input signal 128. The second input signal 128 is now as a second voltage (e.g., a low voltage) by operation of the isolator 116. The second circuit 108 then processes the second input signal 128 and generates a second output signal 132 that is communicated to additional circuitry or controller components.

Even though the first circuit 104 operates at a different voltage than the second circuit 108 and there is an electrical isolation between the two circuits 104, 108, the isolator 116 is able to preserve the information from the first output signal 124 and communicate that information to the second circuit 108 via the second input signal 128. The second input signal 128 may correspond to a logical representation or copy of the first output signal 124. The second input signal 128 is essentially a reproduction of the first output signal 124 on different circuitry and at a different potential. It should be appreciated that the isolator 116 may be designed to carry information across the isolation boundary 112 in two different directions, either sequentially or simultaneously.

Figure 2:
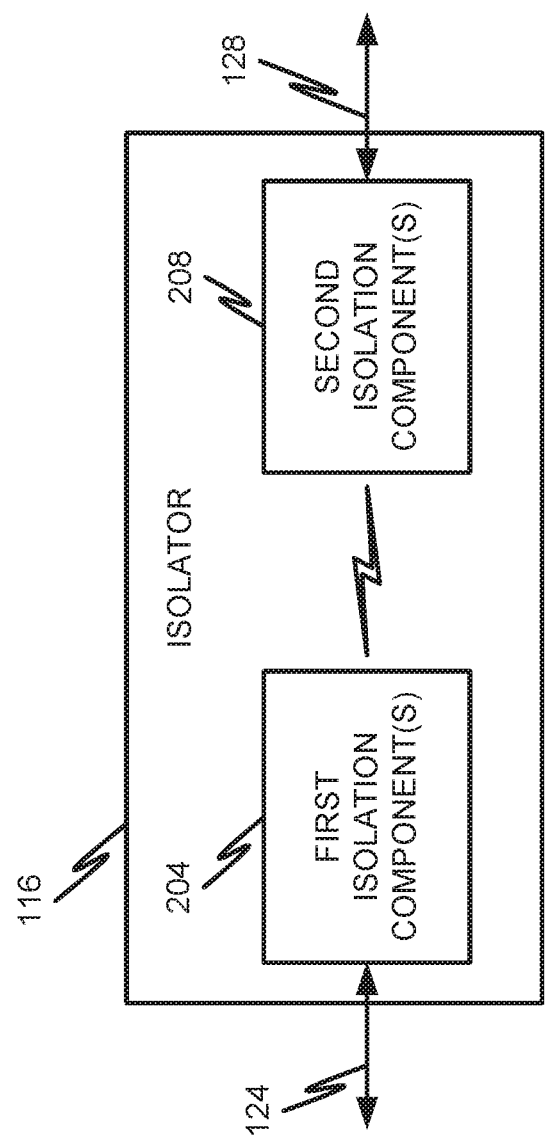
FIG. 2 is a schematic block diagram depicting details of an isolator in accordance with embodiments of the present disclosure.

With reference now to FIG. 2, additional details of the isolator 116 will be described in accordance with at least some embodiments of the present disclosure. The isolator 116, as discussed above, is responsible for communicating information between the first circuit 104 and second circuit 108 while simultaneously maintaining the isolation boundary 112 between the circuits 104, 108. Communication of the signal 124 across the isolation boundary 112 is achieved by one or more isolation components 204, 208, which may correspond to optical or optoelectronic isolation components as will be discussed in further detail herein.

The isolator 116 may comprise first isolation component(s) 204 on its first side and second isolation component(s) 208 on its second side. The first isolation component(s) 204 and second isolation component(s) 208 may correspond to optoelectronic devices (e.g., LEDs, photodetectors, photodiodes, lasers, etc.), capacitive devices (e.g., capacitive plates), inductive devices (e.g., inductors, antennas, etc.), modulators, demodulators, encoders, decoders, driver circuits, and other electrical elements that work together to communicate signals between one another wirelessly, thereby maintaining the isolation boundary 112. In some embodiments, the isolation components 204, 208 communicate with one another via optical coupling (e.g., by the transmission and reception of optical signals in the form of photons). Other coupling techniques such as inductive coupling, magnetic coupling, capacitive coupling, or the like may also be used by isolator 116.

Figure 3:
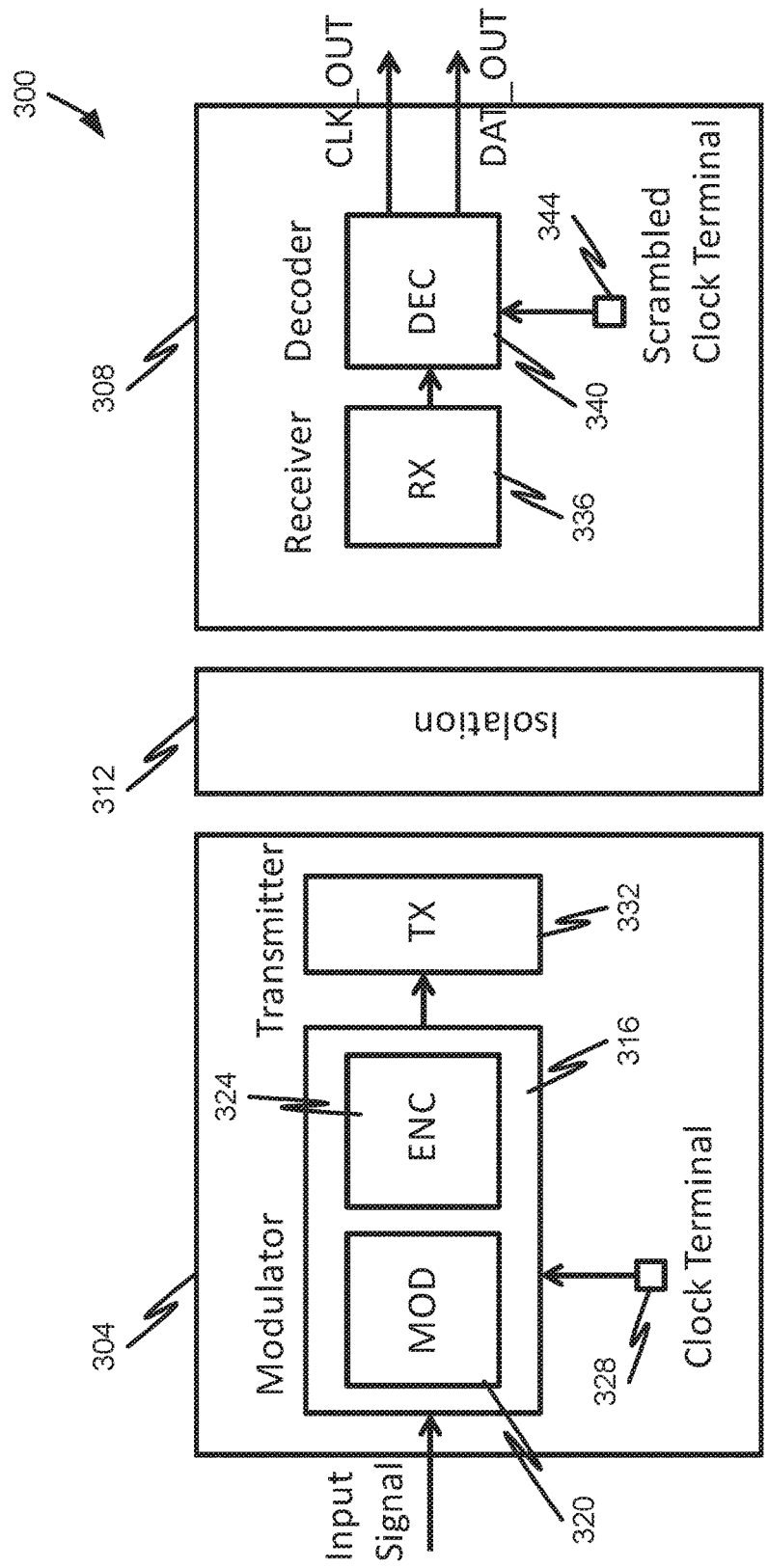
FIG. 3 is a block diagram of a first illustrative isolation device in accordance with embodiments of the present disclosure.

FIG. 3 depicts a first illustrative example of an isolation device 300 in accordance with at least some embodiments of the present disclosure. Unless otherwise described, it should be appreciated that similar components in isolation device 300 may have similar or identical features/functions to other isolators 116 or isolation devices described herein without departing from the scope of the present disclosure. The isolation device 300 is shown to include first isolator circuitry 304 and second isolator circuitry 308 separated by an isolation boundary 312. In some embodiments, the isolation boundary 312 may be an optical element, a capacitive insulator, or any other type of electrically-insulative material.

The first isolator circuitry 304 includes a modulator 316, a clock terminal 328, and a transmitter 332. The modulator 316 is shown to include a modulation unit 320 and an encoder unit 324. The first isolator circuitry 304 or components thereof may be considered first isolation components 204 that receive the input signal 124 from the first circuit 104. Each component of the first isolator circuitry 304 may be mounted on a common lead or leadframe of an isolation or communication package. Alternatively or additionally, some components of the first isolator circuitry 304 may be mounted on a first leadframe or substrate and other components of the first isolator circuitry 304 may be mounted on a second leadframe or substrate. In some embodiments, the first isolator circuitry 304 is incorporated into a first IC chip. In some embodiments, the first isolator circuitry 304 may be considered part of the first isolation components 204 of isolator 116.

The modulator 316 is shown to receive an input clock signal from clock terminal 328. The input clock signal, as will be described herein, may correspond to an unscrambled clock signal having a substantially constant frequency. The modulation unit 320 and encoder unit 324 may both operate based on the clock signal received from clock terminal 328. The modulator 316 will use the modulation unit 320 and encoder unit 324 to modulate/encode the input data signal 124. This modulated/encoded signal is then provided to the transmitter 332 which includes hardware components that enable transmission of the modulated/encoded signal across the isolation boundary 312 without transferring electrical current across the isolation boundary 312. In some embodiments, the transmitter 332 includes optoelectronic components that enable the transmission of a modulated optical signal across the isolation boundary 112. Non-limiting examples of suitable optoelectronic components include LEDs, lasers, VCSELS, an array of LEDs, an array of lasers, combinations thereof, and the like. Alternatively or additionally, the transmitter 332 may include capacitive components that enable the transmission of a modulated signal across the isolation boundary 312. For instance, the transmitter 332 may include one or more capacitive plates (or similar elements capable of receiving and holding a charge). Alternatively or additionally, the transmitter 332 may include an antenna or inductive components that enable the transmission of a modulated signal across the isolation boundary 312.

The second isolator circuitry 308 includes components that are configured to receive the signal transmitted by the transmitter 332 and generate one or more output signals based on the received signal. The signals output by the second isolator circuitry 308 may include a data output signal and a clock output signal. In some embodiments, the second isolator circuitry 308 includes a receiver 336, a decoder 340, and a scrambled clock terminal 344. Each component of the second isolator circuitry 308 may be mounted on a common lead or leadframe of an isolation or communication package. Alternatively or additionally, some components of the second isolator circuitry 308 may be mounted on a first leadframe or substrate and other components of the second isolator circuitry 308 may be mounted on a second leadframe or substrate. In some embodiments, the second isolator circuitry 308 is incorporated into an IC chip that may be the same or different from the IC chip in which the first isolator circuitry 304 is incorporated. In some embodiments, the second isolator circuitry 308 may be considered part of the second isolation components 208 of isolator 116.

The nature of the receiver 336 may depend upon the type of components used for the transmitter 332. For instance, if optoelectronic components are used for the transmitter 332, then corresponding optoelectronic components may be used for the receiver 336. Non-limiting examples of such optoelectronic components include photodiodes, an array of photosensitive cells provided on an IC chip, or the like. Alternatively or additionally, if capacitive components are used for the transmitter 332, then corresponding capacitive components may be used for the receiver 336. A non-limiting example of a suitable capacitive component includes a capacitive plate or multiple capacitive plates.

The receiver 336 receives signals without receiving electrical current from the transmitter 332. The receiver 336 then transforms the received signals into an output that is delivered as an electrical current to the decoder 340. The decoder operates using a scrambled clock signal received via the scrambled clock terminal 344. In some embodiments, the scrambled clock signal received via the scrambled clock terminal 344 is different from the clock terminal 328, but not so different that it becomes impossible to recover the data and clock from the signal transmitted by transmitter 332. The decoder 340 includes circuitry that decodes the signal from the receiver 336 and outputs the data and clock signals separately to the second circuit 108 in the form of signal 128.

Unfortunately, when the clock signal at clock terminal 328 is operating at a relatively high frequency, there is a likelihood of EMI. To reduce this EMI, embodiments of the present disclosure propose the use of a scrambled clock signal at the scrambled clock terminal 344. The scrambled clock signal driving the decoder 340 is established in such a way that the decoder 340 can achieve good data-recovery functionality but the clock signal is scrambled within a narrow range, thereby preserving the synchronous relationship between the clock and the data, which effectively ensures a stable setup and hold time. However, the scrambled clock signal also helps to reduce EMI by reducing the energy distribution across a frequency spectrum in addition to reducing a highest dominant peak value of the clock signal in the frequency spectrum. By reducing the energy distribution and reducing the height of the dominant peak value, the overall EMI of the isolator 300 is reduced. Advantageously, because the scrambled clock signal is not varied too significantly with respect to the clock signal used at clock terminal 328, the ability of the decoder 340 to effectively recover the data and clock from the signal transmitted by the transmitter 332 is maintained.

FIGS. 4A and 4B highlight the features of the clock signal in its frequency domain as compared to the scrambled clock signal in its frequency domain. As shown in FIG. 4A, a first energy distribution is shown in the first frequency spectrum for the clock signal received at clock terminal 328. As can be seen in FIG. 4A, there is a first dominant peak value at the first harmonic of the frequency. Additionally, the clock signal has a substantially constant frequency (e.g., the Δf1 is less than 3% of a nominal frequency). In other words, the clock signal operates at a desired and substantially constant frequency such that only first, third, and fifth harmonic (and possibly other odd harmonics) are present in the frequency domain of the clock signal. This tight bound on the value of Δf1 helps to ensure that a clean signal is generated and transmitted by the first isolator circuitry 304.

The second isolator circuitry 308, on the other hand, operates with the scrambled clock signal that exhibits a frequency distribution as shown in FIG. 4B. In contrast to the frequency behavior of the clock signal, the scrambled clock signal has a more widely dispersed energy distribution and more than just odd harmonics are present in the frequency domain of the scrambled clock signal. In particular, FIG. 4B shows the scrambled clock signal as having first, second, third, fourth, and fifth harmonics, but the dominant peak value at the first harmonic of f2 (e.g., the scrambled clock frequency) is lower than the dominant peak value of the clock signal in its frequency domain. This helps to reduce the EMI created by the clock signals.

As shown in FIGS. 4A and 4B, the Δf1 is less than Δf2. In some embodiments, f2 is substantially equal to f1 plus or minus the Δf2. In some embodiments, Δf2 is less than plus or minus 10% of the f1. Alternatively or additionally, the difference between the clock frequency f1 and the scrambled clock frequency f2 is less than 10% of the clock frequency f1. By maintaining these relatively small differences between f1 and the variations of f2, the decoder 340 is able to accurately decode the data and clock from the signal received from the receiver 336.

Figure 5:
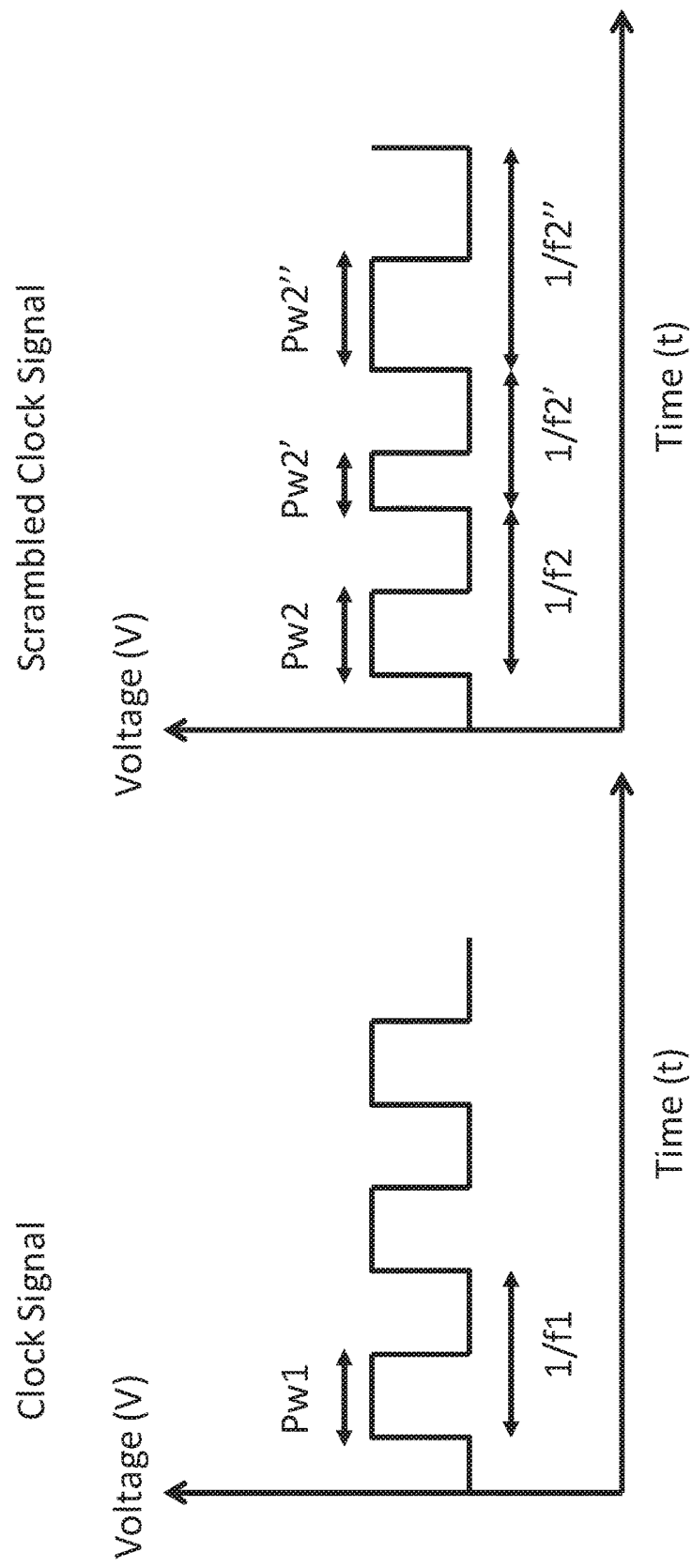
FIG. 5 depicts both a clock signal and scrambled clock signal in accordance with embodiments of the present disclosure.

FIG. 5 depicts another set of waveforms that help explain the differences between the clock signal at the clock terminal 328 and the scrambled clock signal at the scrambled clock terminal 344. In particular, the clock signal is shown to have a substantially constant pulse width Pw1 and a period of 1/f1. Conversely, the scrambled clock signal exhibits a variable pulse width that can be any value between a minimum pulse width Pw2' and a maximum pulse width Pw2". The average pulse width of the scrambled clock signal can be represented as a scrambled pulse width Pw2 and the average period of the scrambled clock signal is approximately 1/f2. In some embodiments, the difference between the scrambled pulse width Pw2 and the unscrambled pulse width Pw1 is less than 10% of the unscrambled pulse width Pw1.

Figure 6:
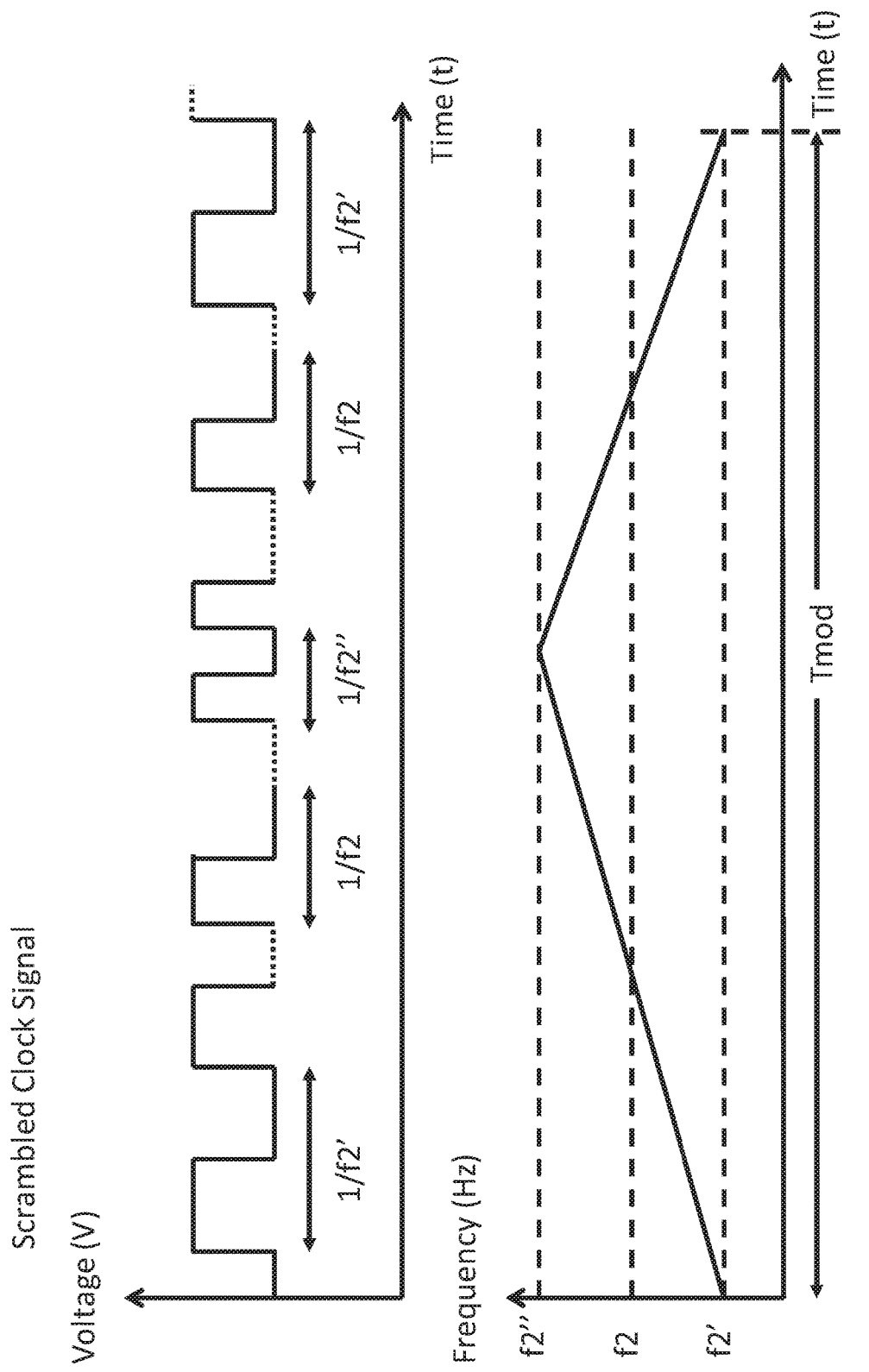
FIG. 6 depicts the voltage and frequency characteristics of a scrambled clock signal in accordance with embodiments of the present disclosure.

As shown in FIG. 5 and in further detail in FIG. 6, the scrambled pulse width may be varied from pulse to pulse. This feature may be achieved in a number of different ways. As one example, a leading edge of each pulse may be varied from pulse to pulse (e.g., relative to a normal start time that would coincide with a substantially constant frequency). Alternatively or additionally, a trailing edge of each pulse may be varied relative to the leading edge. Thus, the width of any given pulse, from one pulse to the next, may vary from any value between Pw2'<Pw2<Pw2". It may also be possible to simultaneously vary both the leading edge and trailing edge of the scrambled clock signal.

FIG. 6 shows that the scrambled clock signal over time may have a variable frequency varying from f2'<f2<f2". The frequency may vary from pulse to pulse according to a scrambling control signal. The scrambling control signal may control the scrambled clock signal to vary its frequency and/or pulse width from pulse to pulse in a random fashion, periodic fashion, sinusoidal fashion, or other continuously-variable fashion. As a non-limiting example, a scrambling control signal may take either a sinusoidal, saw tooth, or triangular waveform. The value of the scrambling control signal (which varies over time) drives the ultimate frequency (or pulse width) of the scrambled clock signal at that instant of time. For instance, if the scrambling control signal is at a minimum value at a first point in time, then the frequency of the scrambled clock signal will be at a corresponding minimum value (e.g., f2 minus Δf2) for that point in time. Conversely, if the scrambling control signal is at a maximum value at a second point in time, then the frequency of the scrambled clock signal will be at a corresponding maximum value (e.g., f2 plus Δf2) for that point in time. If the scrambling control signal is at an average value at yet another point in time, then the frequency of the scrambled clock signal will be at an average value (e.g., f2) for that point in time. It should be appreciated that the scrambled clock signal can have a frequency of any value (integer or non-integer value) between the maximum possible frequency (e.g., f2 plus Δf2) and the minimum possible frequency (e.g., f2 minus Δf2).

FIG. 6 also shows that the time or period over which the frequency of the scrambled clock signal is modulated Tmod can last for a number of pulses. In some embodiments, the value of the modulation period Tmod can be anywhere between 10 and 100 pulses of the scrambled clock signal. In some embodiments, the modulation period (e.g., the period of the scrambling control signal) Tmod may be approximately 100/f2. Thus, the modulation period Tmod may depend upon the average frequency of the scrambled clock signal.

Figure 7:
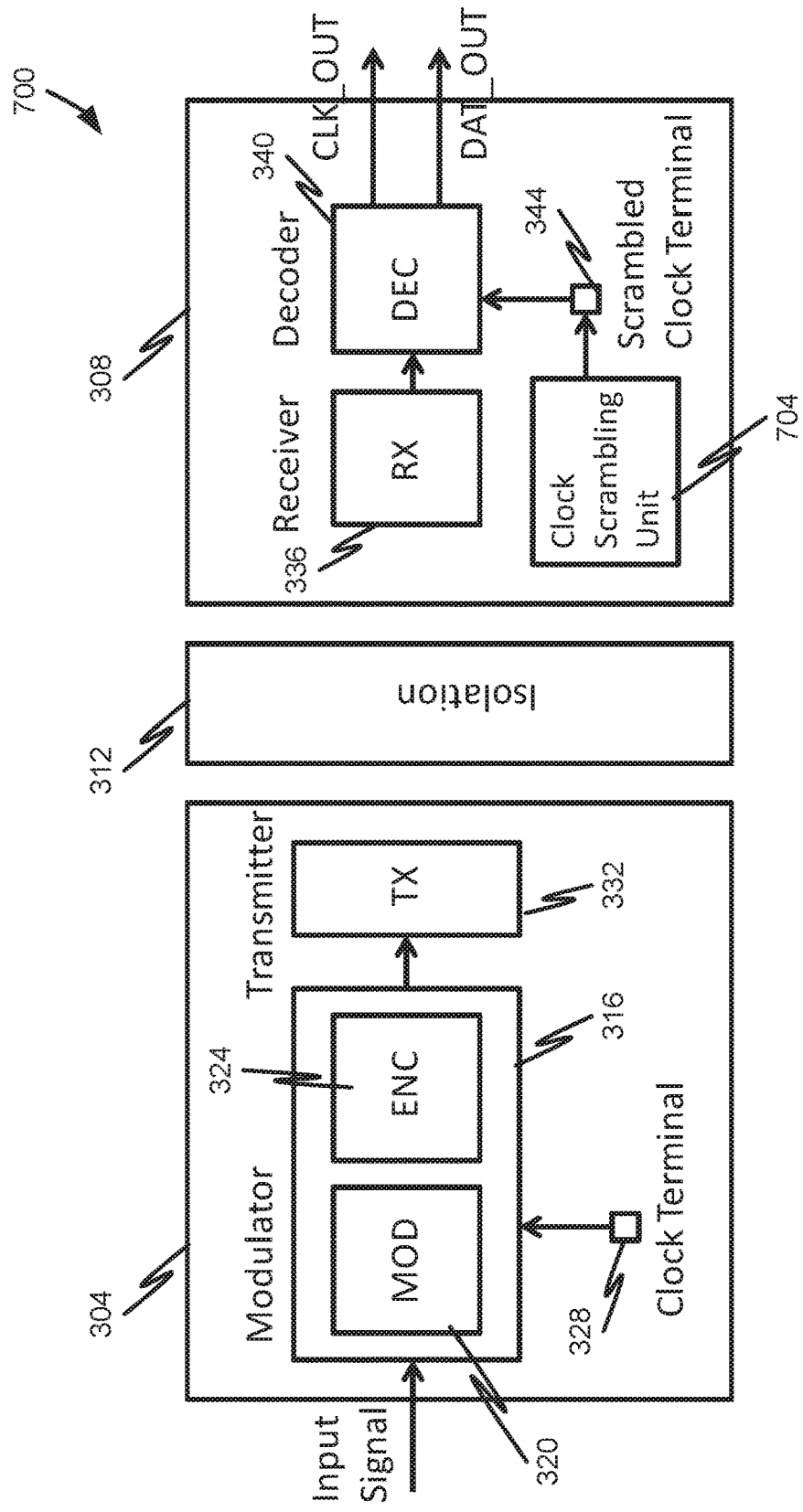
FIG. 7 is a block diagram of a second illustrative isolation device in accordance with embodiments of the present disclosure.

With reference now to FIG. 7, additional details of an isolation device 700 that can be used to generate a scrambling control signal will be described in accordance with at least some embodiments of the present disclosure. Unless otherwise described, it should be appreciated that isolation device 700 may have similar or identical features/functions/components to other isolators/isolation devices (e.g., isolation device 300 or isolator 116). These similar or shared features/functions/components may be similar or identical to the features/functions/components already described herein with respect to the other isolators/isolation devices. For instance, the first isolator circuitry 304 of isolation device 700 may be similar or identical to the first isolator circuitry 304 of isolation device 300. Likewise, many components of the second isolator circuitry 308 in the isolation device 700 are similar or identical to components of the second isolator circuitry 308 in the isolation device 300. The second isolator circuitry 308 in isolation device 700 differs, however, in that the second isolator circuitry 308 further includes a clock scrambling unit 704.

The clock scrambling unit 704 is designed to operate as a narrow-range clock scrambling unit that is configured to vary one or both of the leading edge and trailing edge of the scrambled clock signal. As discussed above, the clock scrambling unit 704 may vary the scrambled clock signal relative to the clock signal by only a minor amount (e.g., less than 10% of the clock signal's average frequency), thereby enabling the decoder 340 to continue operating as designed; however, the clock scrambling unit 704 creates enough variability in the scrambled clock signal at the scrambled clock terminal 344 that the EMI produced by the isolation device 700 is reduced. This reduction in EMI emission is achieved by spreading out the energy distribution along the frequency domain of the scrambled clock signal, by reducing the size of the dominant peak frequency value in the scrambled clock signal, and/or by introducing additional harmonics to the scrambled clock signal that are not present in the clock signal.

Figure 4:
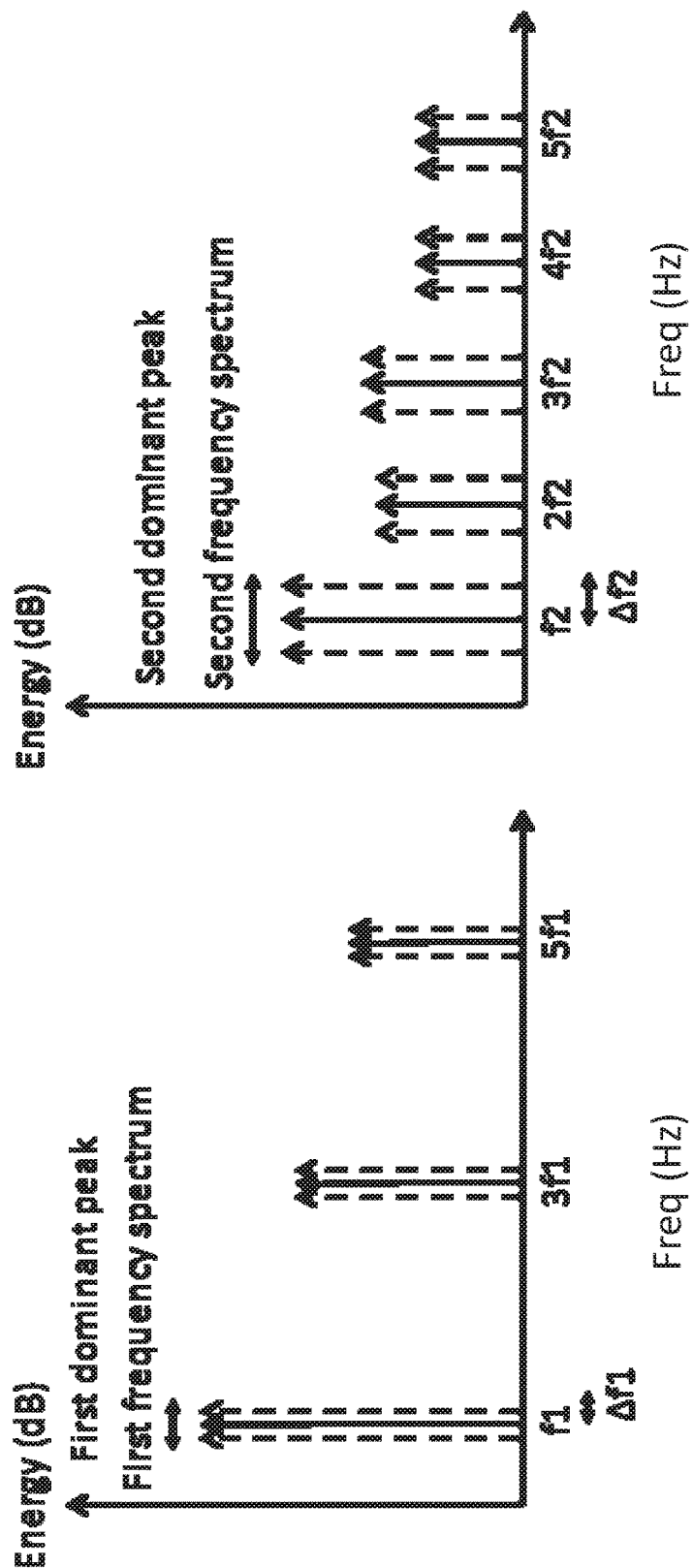
FIG. 4A depicts a first energy distribution of the clock signal used in the transmitter in accordance with embodiments of the present disclosure.
FIG. 4B depicts a second energy distribution of a scrambled clock signal used in the receiver in accordance with embodiments of the present disclosure.

As discussed in connection with FIGS. 4 and 5, the clock scrambling unit 704 may control and vary (either programmatically, randomly, or according to a periodic control signal) the frequency and/or pulse width of the scrambled clock signal from pulse to pulse. Additional details of the circuit components that may be included in the clock scrambling unit will be described in further detail herein with reference to FIG. 13.

Figure 8:
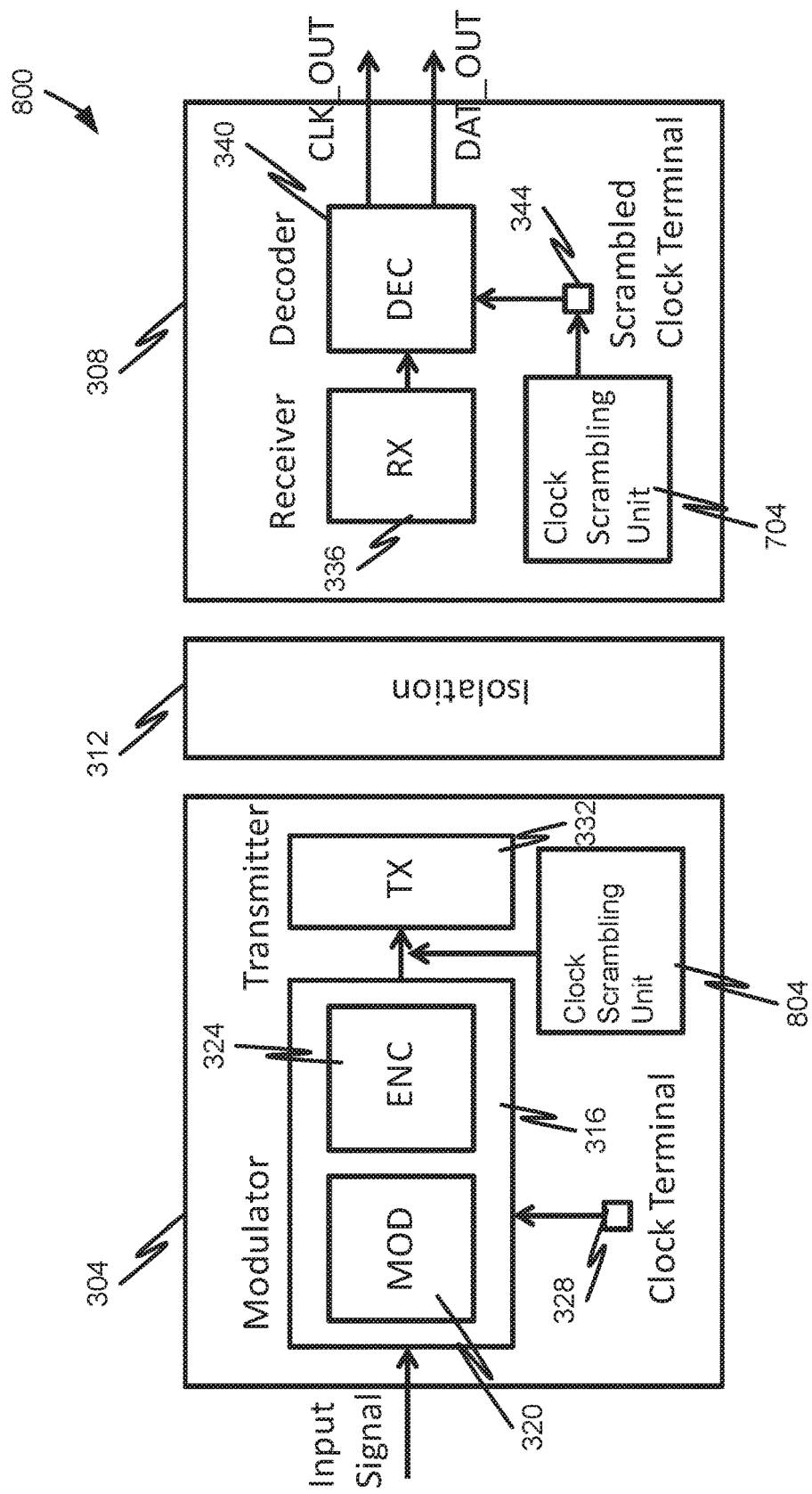
FIG. 8 is a block diagram of a third illustrative isolation device in accordance with embodiments of the present disclosure.

With reference now to FIG. 8, additional details of an isolation device 800 will be described in accordance with at least some embodiments of the present disclosure. The isolation device 800 may have similar or identical features/functions/components to other isolators/isolation devices (e.g., isolation device 700, isolation device 300, or isolator 116). These similar or shared features/functions/components may be similar or identical to the features/functions/components already described herein with respect to the other isolators/isolation devices. For instance, the second isolator circuitry 308 of isolation device 800 may be similar or identical to the second isolator circuitry 308 of isolation device 700.

The first isolator circuitry 304 in isolation device 800 differs from previous isolation devices described herein because the first isolator circuitry 304 of the isolation device 800 is shown to include a clock scrambling unit 804. The clock scrambling unit 804 provides an input or control signal to the signal transmitted from the modulator 316 to the transmitter 332. In some embodiments, the clock scrambling unit 804 operates similarly to clock scrambling unit 704, has components similar to clock scrambling unit 704, but is simply located in the first isolator circuitry 304.

In some embodiments, the clock scrambling unit 804 is adapted to intercept the modulated signal transmitted between the modulator 316 and the transmitter 332. The clock scrambling unit 804 may exhibit similar behavior to clock scrambling unit 704 and, as such, may have similar or identical components to clock scrambling unit 704.

Figure 9:
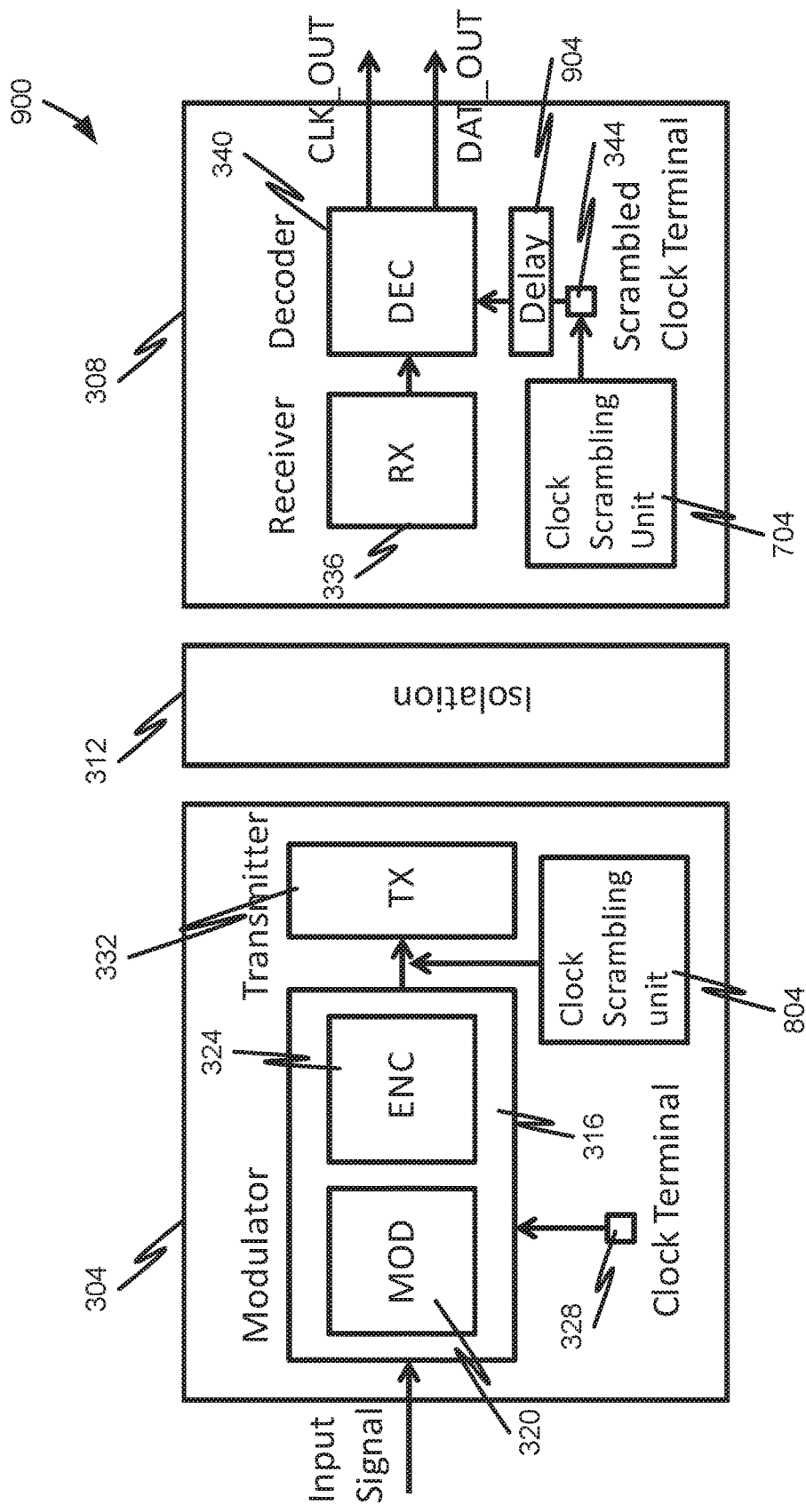
FIG. 9 is a block diagram of a fourth illustrative isolation device in accordance with embodiments of the present disclosure.

With reference now to FIG. 9, additional details of an isolation device 900 will be described in accordance with at least some embodiments of the present disclosure. The isolation device 900 may have similar or identical features/functions/components to other isolators/isolation devices (e.g., isolation device 800, isolation device 700, isolation device 300, or isolator 116). These similar or shared features/functions/components may be similar or identical to the features/functions/components already described herein with respect to the other isolators/isolation devices. For instance, the first isolator circuitry 304 of isolation device 900 may be similar or identical to the first isolator circuitry 304 of isolation device 800.

The second isolator circuitry 308, however, is shown to further include a delay circuit 904 positioned between the clock scrambling unit 704 and decoder 340. In some embodiments, the delay circuit 904 is positioned between the scrambled clock terminal 344 and the input of the decoder 340. In some embodiments, the delay circuit 904 generates a delay signal in accordance with the periodic scrambling control signal generated by the clock scrambling unit 704. In some embodiments, the amount by which the scrambled clock signal received at the scrambled clock terminal 344 is delayed can vary and be modulated in a specific manner in accordance with the scrambling control signal. In other words, the amount of delay introduced into the scrambled clock signal may vary over time similarly to the modulation of the scrambling control signal that is modulated with a modulation period Tmod. In some embodiments, the period of delay Tdelay coincides with the modulation period Tmod, which can be anywhere between 10 pulses and 100 pulses without departing from the scope of the present disclosure.

Figure 10:
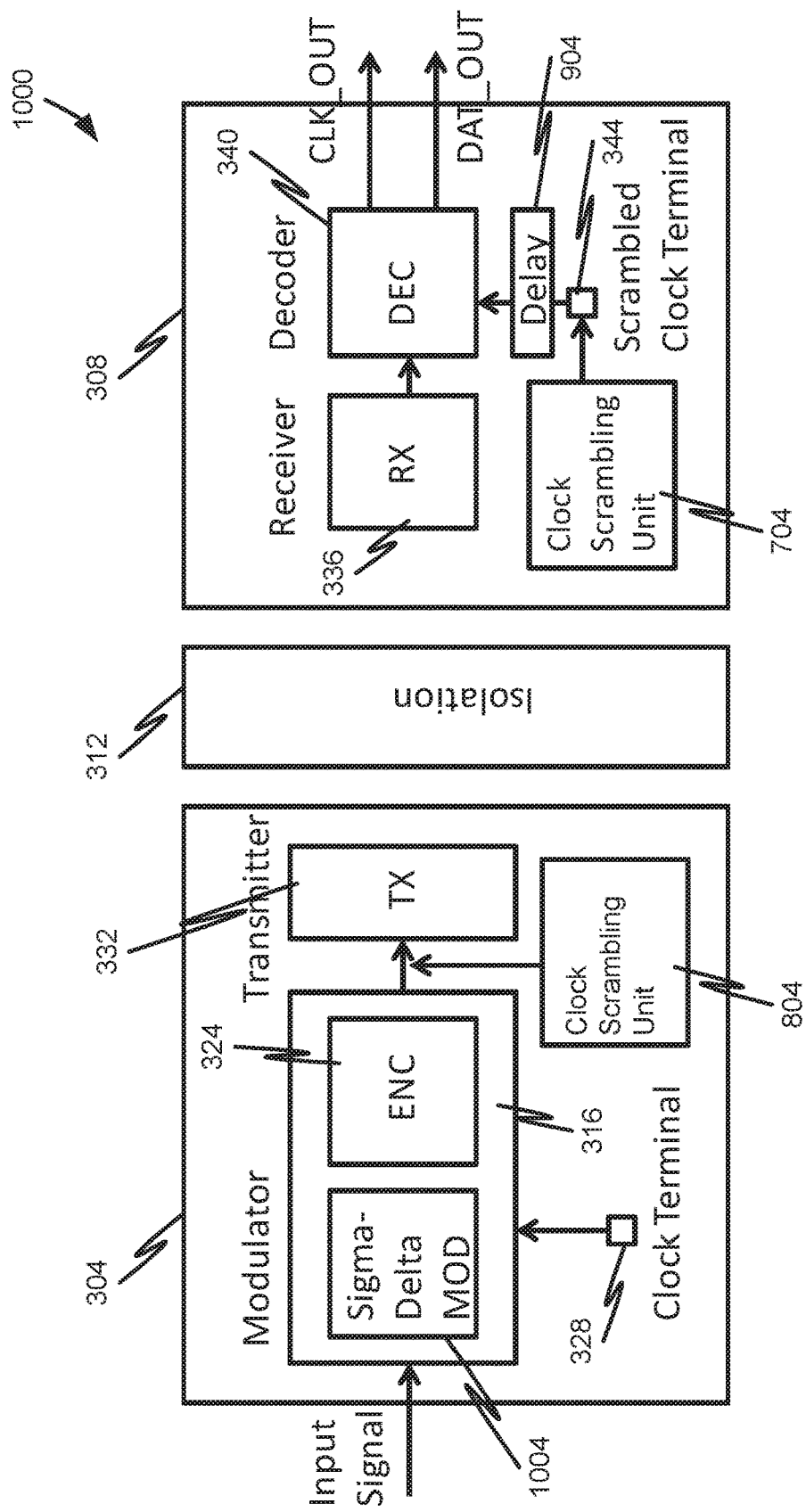
FIG. 10 is a block diagram of a fifth illustrative isolation device in accordance with embodiments of the present disclosure.

With reference now to FIG. 10, additional details of an isolation device 1000 will be described in accordance with at least some embodiments of the present disclosure. The isolation device 1000 may have similar or identical features/functions/components to other isolators/isolation devices (e.g., isolation device 900, isolation device 800, isolation device 700, isolation device 300, or isolator 116). These similar or shared features/functions/components may be similar or identical to the features/functions/components already described herein with respect to the other isolators/isolation devices. For instance, the second isolator circuitry 308 of isolation device 1000 may be similar or identical to the second isolator circuitry 308 of isolation device 900.

The isolation device 1000 further exhibits a different modulator 316 from the other isolation devices depicted and described herein. Specifically, the modulator 316 in the first isolator circuitry 304 is shown to include a sigma-delta modulator 1004 as part of the modulator 316. The sigma-delta modulator 1004 may be internally clocked or externally clocked without departing from the scope of the present disclosure. The sigma-delta modulator 1004 may include any type of known circuit components traditionally included in sigma-delta modulators (e.g., summers, integrators, comparators, flip-flops, ADCs, DAC, etc.). The sigma-delta modulator 1004 may utilize a relative high sampling rate (e.g., in the range of MHz), which is effectively an oversampling of the input signal.

Figure 11:
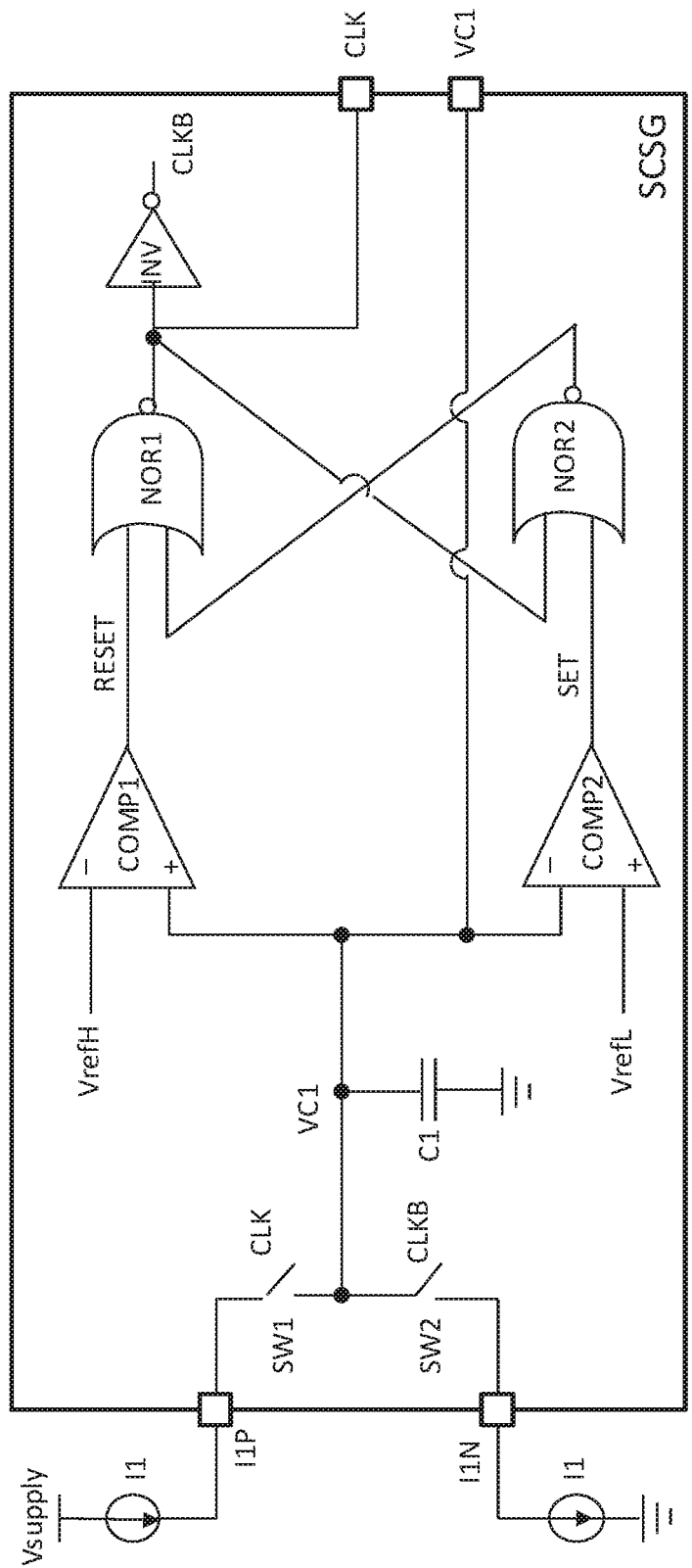
FIG. 11 is a circuit diagram of an illustrative scrambling control signal generator in accordance with embodiments of the present disclosure.
Figure 12:
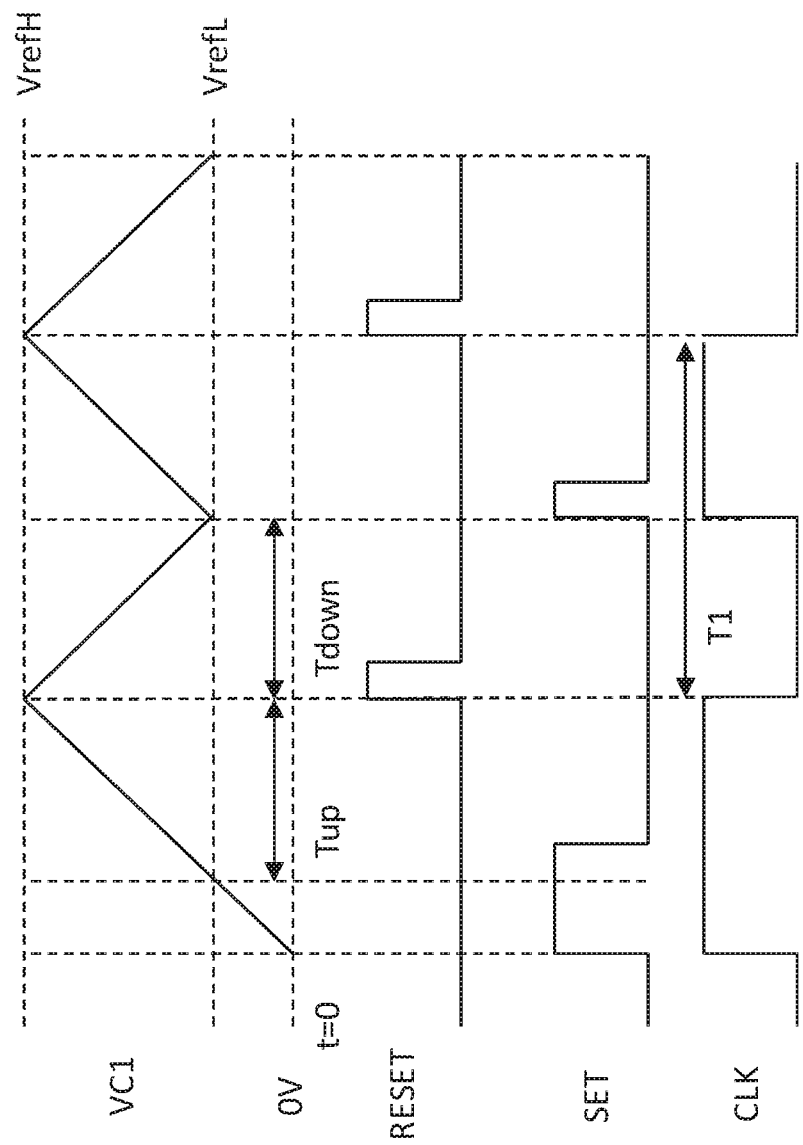
FIG. 12 is a timing diagram depicting behaviors of the scrambling control signal generator depicted in FIG. 11.

With reference now to FIG. 11, an illustrative scrambling control signal generator is shown in accordance with embodiments of the present disclosure. The scrambling control signal generator (SCSG) is shown with two outputs VC1 and CLK. The scrambling control signal generator SCSG is used to generate the clock signal CLK and frequency of the clock signal f1 in addition to generating a triangular (or other type of periodic) waveform VC1. FIG. 12 depicts a timing diagram of the periodic output VC1 as well as the clock signal CLK, which is shown to have a clock frequency of f1. The clock frequency f1 is effectively 1/T1 or 1/(Tup+Tdown).

In some embodiments, the scrambling control signal generator SCSG is made up of two comparators (COMP1, COMP2), a charge and discharge circuit (current source I1, switches SW1 and SW2, and capacitor C1), and a RS latch (NOR1 and NOR2). The two reference levels VrefH and VrefL set the threshold voltages of the two comparators COMP1 and COMP2, respectively.

The output VC1 is a triangular waveform representing the charge and discharge voltage profile of capacitor C1. Although depicted as a triangular waveform in FIG. 12, it should be appreciated that the scrambling control signal generator SCSG may be modified to generate other types of periodic control signals (e.g., sinusoidal, saw tooth, etc.)

The output VC1 is shown to have a peak-to-peak voltage level from VrefL to VrefH. At time t=0, assuming capacitor C1 starts up with zero charge, a SET signal goes high and RESET goes low causing CLK to go high and CLKB to go low. The first switch SW1 turns on and the second switch SW2 turns off (because the switches SW1 and SW2 operate in opposite states to ensure that both input terminals I1P and I1N are not simultaneously connected to the capacitor C1 and other components of the scrambling control signal generator SCSG. At the onset, the capacitor C1 charges up at a rate determined by the source current I1 and C1. As the output VC1 goes up and reaches the level VrefH, RESET goes high causing CLK to go low and CLKB to go high. Then the first switch SW1 turns off and the second switch SW2 turns on. This causes the capacitor C1 to then discharge at a rate determined by the sink current I1 and C1.

If the source and sink currents I1 are the same, then the charging and discharging times are the same, which is given by:

$$Tup=Tdown=(VrefH-VrefL)*C1/I1$$

To change the frequency of output VC1 or CLK, for example to a lower frequency, sink current I1 can be made smaller or the capacitor C1 made larger. As a result, capacitor C1 charges and discharges slower, and output VC1 then oscillates between the two levels VrefL and VrefH at a slower rate, thereby increasing the modulation period Tmod.

Figure 13:
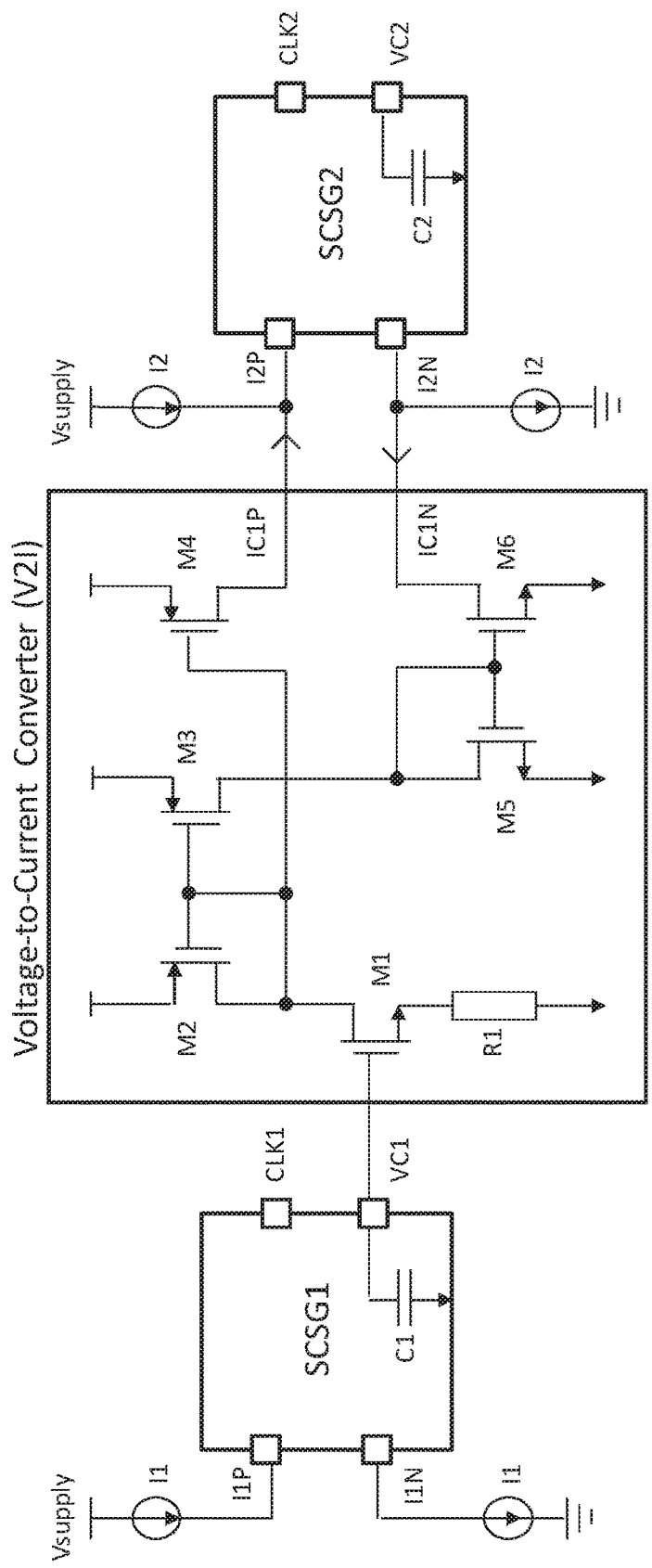
FIG. 13 is a circuit diagram of an illustrative clock scrambling unit to generate a scrambled clock signal in accordance with embodiments of the present disclosure.

With reference now to FIG. 13, additional details of a clock scrambling unit 704, 804 will be described in accordance with at least some embodiments of the present disclosure. The clock scrambling unit 704, 804 is shown as being positioned between a pair of scrambling control signal generators SCSGs. Specifically, a first scrambling control signal generator SCSG1 provides its output VC1 as an input to a voltage-to-current converter V2I whereas inputs of a second scrambling control signal generator SCSG2 are connected to current outputs of the voltage-to-current converter V2I. The components in the signal generators SCSG1, SCSG2 may be similar with the exception of the capacitors in each signal generator. Specifically, the first signal generator SCSG1 may have a first capacitor C1 whereas the second signal generator SCSG2 may have a second capacitance C2. The first capacitance C1 may be between 10 times and 100 times larger than the second capacitance C2. The difference in capacitances between capacitors C1 and C2 helps to adjust or determine the energy distribution of the scrambled clock signal over its frequency spectrum.

The first generator SCSG1 generates a triangular voltage waveform output VC1, which is converted into sourcing triangular current waveform IC1P and sinking triangular current waveform IC1N for the second generator SCSG2 by the voltage-to-current converter V2I. The magnitude of the triangular current waveform IC1=(VC1−VGSM1)/R1 where VGSM1 is the gate-source voltage of transistor M1, and the current mirror ratio between transistors (M2 and M3), (M2 and M4), and (M5 and M6) is approximately equal to one.

The current charging and discharging the second capacitor C2 in the second signal generator SCSG2 is I2+IC1, which is a triangular current waveform (or other periodic signal). If I1<<I2 and/or C1>>C2, then the current charging and discharging the second capacitor C2, is a slow changing triangular current waveform. Typically, output VC1 has a period about 100 times that of VC2 if C1>>C2 and/or I1<<I2 (e.g., at least an order of magnitude larger). The second signal generator SCSG2 then produces the scrambled clock signal CLK2, which has a pulse width Pw2 and frequency f2 that is being modulated in a triangular manner over the modulation period Tmod. If the capacitors C1 and C2 have relatively similar capacitance values, and the currents I1 and I2 have relatively similar current values, then VC1 and VC2 will have relatively similar period. The scrambled clock signal will not exhibit as much energy distribution across the entire frequency spectrum as if the outputs VC1 and VC2 were substantially different (e.g., at least an order of magnitude different in their period).

Figure 14:
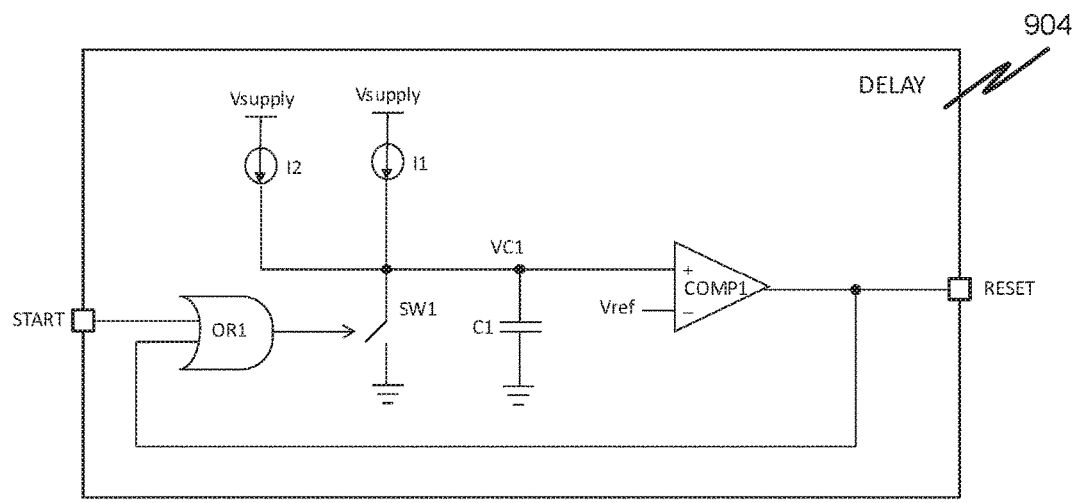
FIG. 14 is a circuit diagram of an illustrative delay circuit in accordance with embodiments of the present disclosure.
Figure 15:
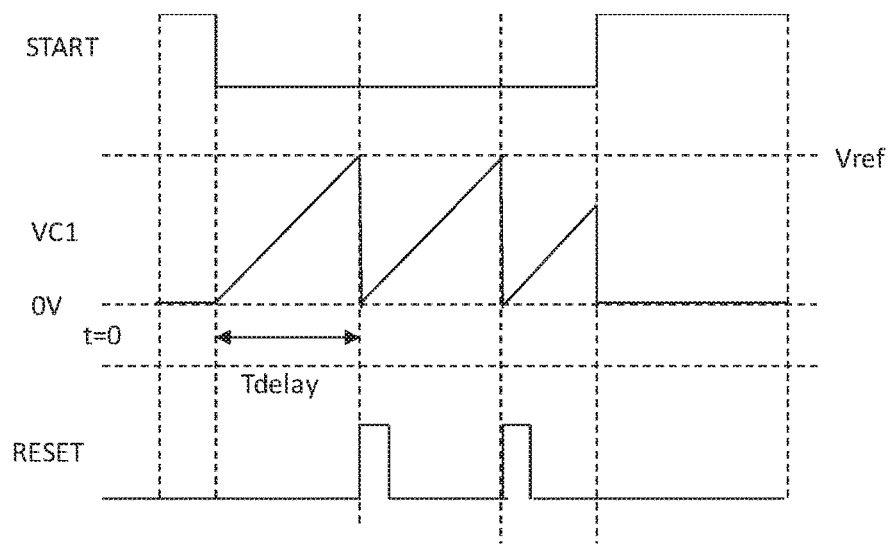
FIG. 15 is a timing diagram depicting behaviors of the delay circuit depicted in FIG. 14.

With reference now to FIGS. 14 and 15, additional details of a delay circuit 904 will be described in accordance with at least some embodiments of the present disclosure. The delay circuit 904 is shown to receive a START signal and output a RESET signal. In some embodiments, the signal generator SCSG can be adapted to act as a timing unit in the form of a delay circuit 904. The delay circuit is made up of a first comparator COMP1, a charge and discharge circuit (current sources (I1 and I2), switch SW1, and capacitor C1) and a logic OR gate OR1.

The reference level Vref sets the threshold voltage of the comparator COMP1. The output VC1 is a triangular waveform (or similar periodic waveform) representing the charge and discharge voltage profile of capacitor C1. Output VC1 has a peak-to-peak voltage level from 0V to Vref. Assuming I2=0, then at time t=0, if START is high, the output of logic gate OR1 is high, causing switch SW1 to turn ON. Capacitor C1 is thus discharged to 0V and RESET is low. When START goes low, the output of logic gate OR1 goes low and turns OFF the switch SW1. Current I1 starts to charge up capacitor C1 at a rate determined by the source current I1 and capacitor C1. As the output VC1 goes up and reaches the level Vref, RESET goes high causing the output of the logic gate OR1 to go high, thus turning on the switch SW1. The capacitor C1 is then discharged to 0V through switch SW1.

At any time when START goes high, the switch SW1 turns ON and the capacitor C1 gets discharged immediately to 0V. Assuming I2=0, the charging time of the capacitor C1 is given by the following:

$$T\text{delay} = V\text{ref} * C1/I1$$

If I2≠0, the charging time of C1 is given by the following:

$$T\text{delay} = V\text{ref} * C1/(I1+I2)$$

Now if I2 is added to the charging circuit, and if I2 is a slowly-varying triangular wave generated by the signal generator SCSG1 and the voltage-to-current converter V2I as shown, then the delay period Tdelay will be modulated in a periodic manner in accordance to the triangular current waveform.

Figure 16:
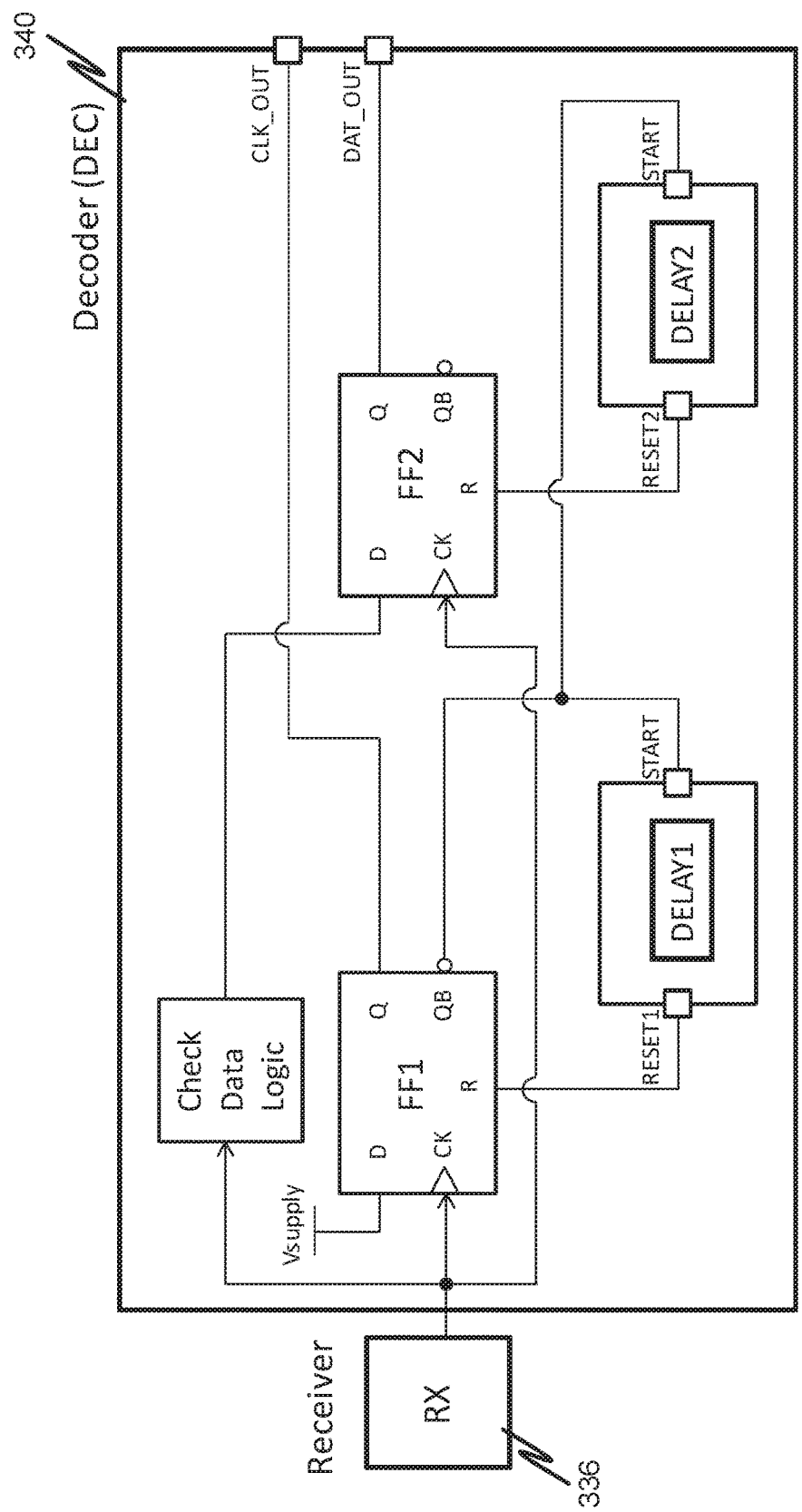
FIG. 16 is a circuit diagram depicting an illustrative decoder in accordance with embodiments of the present disclosure.

With reference now to FIG. 16, additional details of a decoder 340 will be described in accordance with at least some embodiments of the present disclosure. The decoder 340 is shown to include a first delay circuit DELAY1 and a second delay circuit DELAY2. The delay circuits DELAY1, DELAY2 may be similar or identical to the delay circuit 904 depicted and described herein.

In some embodiments, the delay circuits DELAY1, DELAY2 are used for the decoding of the outputs (e.g., clock output CLK_OUT and data output DAT_OUT). In this non-limiting example, both outputs CLK_OUT are DAT_OUT are triggered by an edge of the signal received from the receiver 336 and both delay circuits DELAY1, DELAY2 are triggered by the START signal. After timeout of the delay circuits DELAY1, DELAY2, the reset signals RESET1 and RESET2 are activated to reset the D flip-flops FF1 and FF2. The whole cycle repeats itself on the next edge of the signal received from the receiver 336.

The START signal ensures that the timings of the delay circuits DELAY1, DELAY2 are synchronized such that a stable setup and hold time relationship is maintained between outputs CLK_OUT and DAT_OUT. The delays introduced by the delay circuits DELAY1, DELAY2 can be modulated in a periodic manner as discussed in connection with FIG. 15, and in doing so the edges of outputs CLK_OUT and DAT_OUT are scrambled to reduce the EMI generated from the isolation device.

As can be appreciated, any of the isolators or isolation devices depicted and described herein may be implemented as on-chip solutions (e.g., as a single silicon wafer). In some embodiments, the isolators or isolation devices may be implemented in an Integrated Circuit (IC) chip having other circuit elements provided therein. Moreover, the terms isolator and isolation device may be interchangeable terms as used herein. Indeed, any system, system component, or specific device exhibiting features and/or functions of an electrical isolator as well as an optical coupler may be considered either an isolator or isolation device. Furthermore, any type of galvanic isolation component may benefit from the proposed systems and/or devices. For instance, an isolator may be configured to use capacitive, optical, inductive, and/or magnetic isolation components without departing from the scope of the present disclosure.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An isolation device, comprising:
   first circuitry;
   second circuitry;
   an isolation material that electrically isolates the first circuitry from the second circuitry;
   a modulator disposed within the first circuitry, the modulator being configured to modulate an input signal into a modulated signal in accordance with a predetermined modulation scheme;
   a transmitter disposed within the first circuitry, the transmitter being configured to transmit the modulated signal across the isolation material to the second circuitry;
   a receiver disposed within the second circuitry, the receiver being configured to receive the modulated signal from the first circuitry;
   a decoder disposed within the second circuitry, the decoder being configured to decode the modulated signal into a reconstructed signal in accordance with the predetermined modulation scheme;
   a clock terminal that receives a clock signal having a first energy distribution across a first frequency spectrum with a first dominant peak value, the clock terminal being disposed within the first circuitry such that the modulator is driven by the clock signal; and
   a scrambled clock terminal disposed in the second circuitry such that the decoder is driven by a scrambled clock signal received at the scrambled clock terminal, the scrambled clock terminal being configured to receive the scrambled clock signal having a second energy distribution across a second frequency spectrum with a second dominant peak value, wherein the second frequency spectrum is wider than the first frequency spectrum.

2. The isolation device of claim 1 further comprising a narrow-range clock scrambling unit that generates the scrambled clock signal.

3. The isolation device of claim 2, wherein the second dominant peak value is lower than the first dominant peak value, wherein the scrambled clock signal comprises a waveform having a first edge and a second edge, and wherein the narrow-range clock scrambling unit varies at least one of the first edge and the second edge in accordance with a scrambling control signal.

4. The isolation device of claim 3, wherein:
   the clock signal has a pulse width (Pw1);
   the scrambled clock signal has a scrambled pulse width (Pw2); and
   the narrow-range clock scrambling unit varies at least one of the first edge and the second edge such that, at any point of time, a difference between the pulse width (Pw1) and the scrambled pulse width (Pw2) is less than 10% of the pulse width (Pw1).

5. The isolation device of claim 3, wherein the clock signal comprises only odd harmonics frequency components and the narrow-range clock scrambling unit varies one of the first edge and the second edge such that the scrambled clock signal comprises both odd and even harmonic frequency components.

6. The isolation device of claim 2, wherein the scrambled clock signal comprises a waveform having a first edge and a second edge, and wherein the narrow-range clock scrambling unit varies both of the first edge and the second edge in accordance with a scrambling control signal.

7. The isolation device of claim 6, wherein:
the clock signal has a clock frequency (f1);
the scrambled clock signal has a scrambled clock frequency (f2); and
the narrow-range clock scrambling unit varies both of the first edge and the second edge such that, at any point of time, a difference between the clock frequency (f1) and the scrambled clock frequency (f2) is less than 10% of the clock frequency (f1).

8. The isolation device of claim 2, wherein the narrow-range clock scrambling unit comprises a receiver portion disposed within the second circuitry and coupled to the decoder.

9. The isolation device of claim 8, wherein the narrow-range clock scrambling unit comprises a transmitter portion disposed within the first circuitry, and wherein the transmitter portion is adapted to intercept the modulated signal between the modulator and the transmitter.

10. The isolation device of claim 2, wherein the narrow-range clock scrambling unit is disposed within the second circuitry.

11. The isolation device of claim 2, wherein the narrow-range clock scrambling unit comprises a scrambling control signal generator that generates a triangular waveform.

12. The isolation device of claim 2, wherein the narrow-range clock scrambling unit comprises a scrambling control signal generator that generates a periodic signal.

13. The isolation device of claim 12, wherein the narrow-range clock scrambling unit further comprises a timing unit that generates a delay signal in accordance with the periodic signal.

14. The isolation device of claim 1, wherein the modulator comprises a sigma-delta waveform modulation circuit to modulate the input signal.

15. The isolation device of claim 1, wherein the transmitter comprises a first capacitive element, the receiver comprises a second capacitive element, and wherein the isolation material is disposed between the first capacitive element and the second capacitive element.

16. The isolation device of claim 1, wherein the transmitter comprises a first optoelectronic element, the receiver comprises a second optoelectronic element, and wherein the isolation material is optically transparent to a wavelength of light emitted by the first optoelectronic element.

17. An isolation system, comprising:
a transmitter that receives an output from a modulator and generates a signal for transmission across an isolation material, wherein the modulator is driven by a first clock signal, wherein the first clock signal comprises a first energy distribution across a first frequency spectrum with a first dominant peak value; and
a receiver that receives the signal transmitted by the transmitter and generates an output based on the received signal, wherein the output of the receiver is provided to a decoder that is driven by a second clock signal, wherein the second clock signal comprises a second energy distribution across a second frequency spectrum with a second dominant peak value, wherein the second dominant peak value is lower than the first dominant peak value, wherein the second frequency spectrum is wider than the first frequency spectrum, wherein the second clock signal is generated by a narrow-range clock scrambling unit, wherein the second clock signal comprises a waveform having a first edge and a second edge, and wherein the narrow-range clock scrambling unit varies at least one of the first edge and the second edge based on a scrambling control signal.

18. The isolation system of claim 17, wherein the transmitter comprises a first optoelectronic element and wherein the receiver comprises a second optoelectronic element.

19. A method of transmitting an input signal across an isolation barrier from a first circuit to a second circuit that is electrically isolated from the first circuit, the method comprising:
modulating the input signal with a modulator that is driven by a first clock having a first energy distribution across a first frequency spectrum;
transmitting the modulated input signal across the isolation barrier;
receiving the transmitted modulated input signal and, in response thereto, generating a received electrical signal in accordance with the transmitted modulated input signal; and
decoding the received electrical signal with a decoder that is driven by a second clock having a second energy distribution across a second frequency spectrum, wherein the second frequency spectrum is wider than the first frequency spectrum, and wherein a transmitter used to transmit the modulated input signal is driven by the second clock.

20. The method of claim 19, wherein the transmitter comprises a first optoelectronic element, wherein the modulated input signal is received at a second optoelectronic element, and wherein the isolation barrier is optically transparent to a wavelength of light emitted by the first optoelectronic element.

* * * * *